(12) United States Patent
Seo et al.

(10) Patent No.: US 11,430,513 B1
(45) Date of Patent: Aug. 30, 2022

(54) NON-VOLATILE MEMORY STRUCTURE AND METHOD FOR LOW PROGRAMMING VOLTAGE FOR CROSS BAR ARRAY

(71) Applicant: International Business Machines Corporation, Armonk, NY (US)

(72) Inventors: Soon-Cheon Seo, Glenmont, NY (US); Youngseok Kim, Upper Saddle River, NJ (US); Dexin Kong, Redmond, WA (US); Takashi Ando, Eastchester, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/391,496

(22) Filed: Aug. 2, 2021

(51) Int. Cl.
*G11C 13/00* (2006.01)
*H01L 27/10* (2006.01)

(52) U.S. Cl.
CPC .......... *G11C 13/0007* (2013.01); *H01L 27/10* (2013.01); *G11C 2213/30* (2013.01); *G11C 2213/56* (2013.01)

(58) Field of Classification Search
CPC ............ G11C 13/0007; G11C 2213/30; G11C 2213/56; H01L 27/10
USPC ....................................................... 356/148
See application file for complete search history.

(56) References Cited

U.S. PATENT DOCUMENTS

| | | | |
|---|---|---|---|
| 9,502,518 B2 | 11/2016 | Liu et al. | |
| 9,570,678 B1 | 2/2017 | Jo et al. | |
| 9,601,546 B1 | 3/2017 | Ando et al. | |
| 9,704,863 B1 | 7/2017 | Cheng et al. | |
| 9,748,352 B2 | 8/2017 | Liu et al. | |
| 9,799,748 B1 | 10/2017 | Xie et al. | |
| 10,608,642 B2 | 3/2020 | Lee et al. | |
| 2014/0203236 A1* | 7/2014 | Chen | H01L 45/1233 257/4 |
| 2019/0245543 A1* | 8/2019 | Lee | H01L 27/1112 |

(Continued)

OTHER PUBLICATIONS

Waser, R., "Integration of TiO2 into Nano-Crossbar Arrays with 100 nm Half Pitch for Resisitve RAM Applications", Electronic Materials Research Laboratory, May 5, 2019, 7 pages.

(Continued)

*Primary Examiner* — Fernando Hidalgo
(74) *Attorney, Agent, or Firm* — Scully, Scott, Murphy & Presser, P.C.; L. Jeffrey Kelly, Esq.

(57) ABSTRACT

A low voltage forming NVM structure including a plurality of ReRAM devices arranged in a cross bar array and sandwiched between a plurality of first electrically conductive structures and a plurality of second electrically conductive structures. Each first electrically conductive structure is oriented perpendicular to each second electrically conductive structure. The plurality of second electrically conductive structures includes a first set of second electrically conductive structures having a first top trench area A1, and a second set of second electrically conductive structures having a second top trench area A2 that is greater than A1. Each second electrically conductive structure of the first set contacts a surface of at least one of the first electrically conductive structures, and each second electrically conductive structure of the second set contacts a top electrode of at least one of the ReRAM devices.

20 Claims, 7 Drawing Sheets

(56) References Cited

U.S. PATENT DOCUMENTS

| | | |
|---|---|---|
| 2020/0083352 A1 | 3/2020 | Chanemougame et al. |
| 2020/0161372 A1 | 5/2020 | Beckmann et al. |
| 2020/0287136 A1 | 9/2020 | Li et al. |
| 2021/0242399 A1* | 8/2021 | Lee .................... H01L 45/1675 |

OTHER PUBLICATIONS

Wong, H.-S., et al., "Metal-Oxide RRAM", Proceedings of the IEEE, Jun. 2012, 20 pp. 1951-1970, vol. 100, Jun. 6.

Wu, E., et al., "Fundamental limitations of existing models and future solutions for dielectric reliability and RRAM applications (Invited)", 2017 IEEE International Electron Devices Meeting (IEDM), Date of Conference: Dec. 2-6, 2017, pp. 21.5.1-21.5.4.

Anonymous et al., "Resistive RAM Conductive Filament Formation Enhancement by Topography", IP.com Technical Disclosure, Feb. 25, 2020, 4 pages.

Anonymous et al., "Process-Induced Forming of RRAM Device with Dummy CMP Structure", IP.com Technical Disclosure, Oct. 27, 2020, 11 pages.

\* cited by examiner

NON-VOLATILE MEMORY STRUCTURE AND METHOD FOR LOW PROGRAMMING VOLTAGE FOR CROSS BAR ARRAY

BACKGROUND

The present application relates to non-volatile memory (NVM), and more particularly to a low forming voltage resistive random access memory (ReRAM) cross bar array embedded in the back-end-on-the-line (BEOL).

NVM or non-volatile storage is a type of computer memory that can retain stored information even after power is removed. In contrast, volatile memory needs constant power in order to retain data.

ReRAM (or sometimes referred to as RRAM) is a type of NVM that is considered as a promising technology for electronic synapse devices or memristors for neuromorphic computing as well as high-density and high-speed NVM applications. In neuromorphic computing applications, a resistance memory device such as ReRAM device can be used as a connection (i.e., synapse) between a pre-neuron and a post-neuron, representing the connection weight in form of device resistance. Multiple pre-neurons and post neurons can be connected through a cross bar array of ReRAMs, which naturally expresses a fully-connected neural network.

For ReRAM and conductive bridge random access memory (CBRAM) devices, a current conducting filament is formed within the dielectric switching layer during an operation called electroforming. Electroforming of ReRAM and CBRAM devices is similar to dielectric breakdown, and it typically follows poison area scaling, i.e., higher forming voltages for smaller ReRAM and CBRAM device sizes. ReRAM forming voltages at sub-micron dimensions are typically greater than 2 volts, and such voltages increase as the dimensions are scaled.

Such high filament forming voltages cannot be supported by metal oxide semiconductor field effect transistors (MOFETs) in state-of-the-art complementary metal oxide semiconductor (CMOS) technologies, therefore multiple MOSFETs need to be stacked one atop the other. Such stacking can provide a significant penalty on the device foot-print. ReRAM electroforming techniques/structures not relying on dive currents by MOFETs are highly desired for device scaling, but there are no current solutions in the NVM field.

SUMMARY

A low voltage forming (less than 2 volts) NVM structure is provided that includes a plurality of ReRAM devices arranged in a cross bar array and sandwiched between a plurality of first electrically conductive structures and a plurality of second electrically conductive structures. Each first electrically conductive structure is oriented perpendicular to each second electrically conductive structure. The plurality of second electrically conductive structures includes a first set of second electrically conductive structures having a first top trench area A1, and a second set of second electrically conductive structures having a second top trench area A2 that is greater than A1. Each second electrically conductive structure of the first set contacts a surface of at least one of the first electrically conductive structures, and each second electrically conductive structure of the second set contacts a top electrode of at least one of the ReRAM devices.

In one aspect of the present application, a NVM structure is provided. In one embodiment of the present application, the NVM structure includes a plurality of first electrically conductive structures oriented in a first direction. The NVM structure further includes a plurality of ReRAM devices arranged in rows and columns and located on the plurality of first electrically conductive structures, wherein each ReRAM device of the plurality of ReRAM devices includes a bottom electrode, a metal oxide layer, and a top electrode. The NVM structure even further includes a plurality of second electrically conductive structures located above the plurality of ReRAM devices and oriented in a second direction which is perpendicular to the first direction. In accordance with the present application, the plurality of second electrically conductive structures includes a first set of second electrically conductive structures having a first top trench area, and a second set second of second electrically conductive structures having a second top trench area that is greater than the first top trench area. In the present application, each second electrically conductive structure of the first set of second electrically conductive structures contacts a surface of at least one of the first electrically conductive structures of the plurality of first electrically conductive structures, and each second electrically conductive structure of the second set of second electrically conductive structures contacts the top electrode of at least one of the ReRAM devices.

In another aspect of the present application, a method of forming a NVM structure is provided. In one embodiment the method includes forming a plurality of first electrically conductive structures oriented in a first direction. Next, a plurality of random access memory (ReRAM) devices is formed on the plurality of first electrically conductive structures, wherein each ReRAM device of the plurality of ReRAM devices includes a bottom electrode, a dielectric switching layer, and a top electrode. A plurality of second electrically conductive structures is then formed above the plurality of ReRAM devices and oriented in a second direction which is perpendicular to the first direction, wherein the plurality of second electrically conductive structures includes a first set of second electrically conductive structures having a first top trench area, and a second set of second electrically conductive structures having a second top trench area that is greater than the first top trench area, wherein each second electrically conductive structure of the first set of second electrically conductive structures contacts a surface of at least one of the first electrically conductive structures of the plurality of first electrically conductive structures, and each second electrically conductive structure of the second set of second electrically conductive structures contacts the top electrode of at least one of the ReRAM devices. Next, a treatment process is performed to induce an antenna effect and convert each dielectric switching layer to a conductive filament.

DETAILED DESCRIPTION

Figure 1:
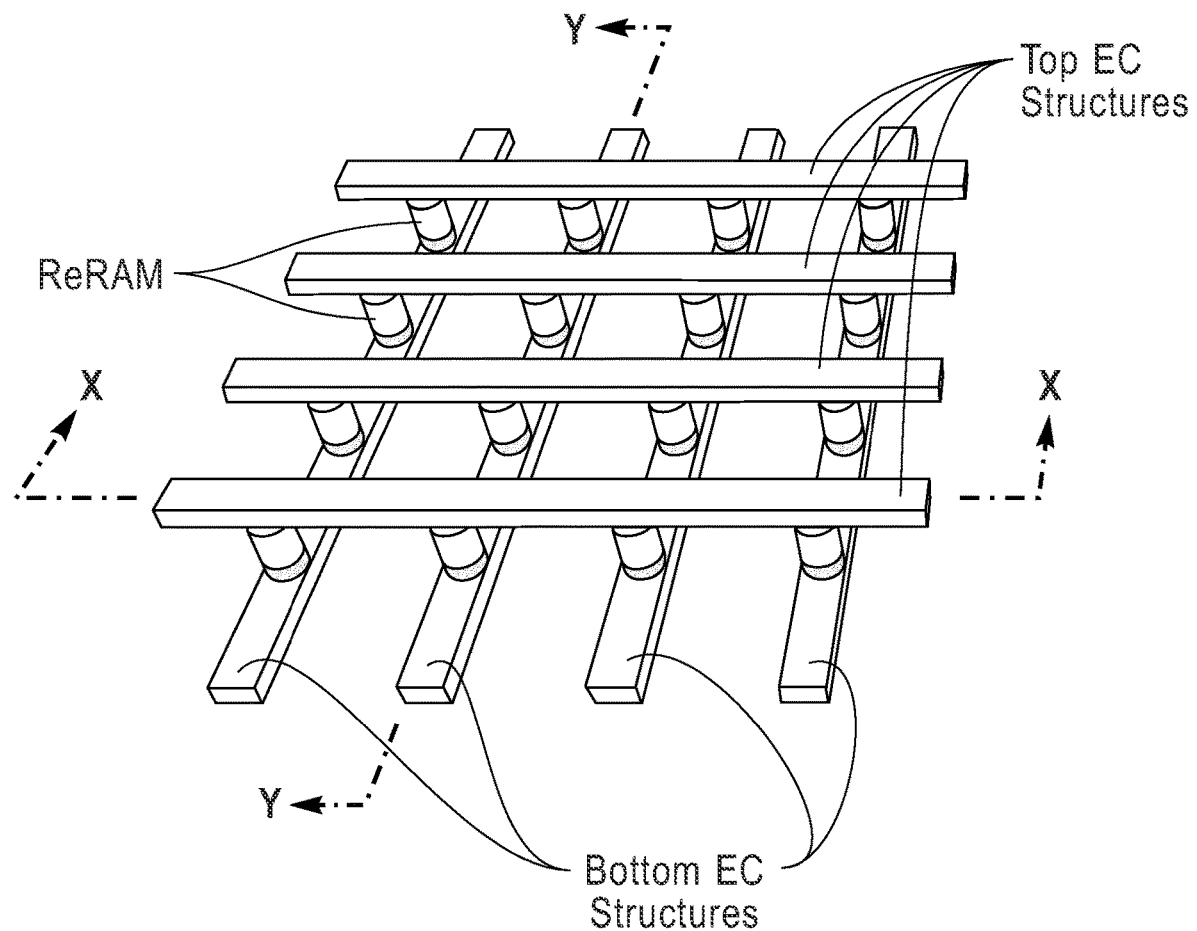
FIG. 1 is a schematic diagram illustrating a typical cross bar NVM array that can be employed in the present application, including a plurality of ReRAM devices sandwiched between a plurality of top electrically conductive structures located along the X-X direction and a plurality of bottom electrically conductive structures located along the Y-Y direction.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a typical cross bar NVM array that can be employed in the present application. The cross bar NVM array of FIG. 1 includes a plurality of ReRAM devices sandwiched between a plurality of top electrically conductive structures (i.e., top EC structures), each oriented along the X-X direction, and a plurality of bottom electrically conductive structures (i.e., bottom EC structures), each oriented along the Y-Y direction, which is perpendicular to the X-X direction. Although FIG. 1 incudes a 4×4 cross bar array, the present application is not limited to the same and other cross bar arrays including any number of ReRAM devices can be employed. In FIG. 1, the top EC structures are oriented parallel to each other, and they lie perpendicular to the bottom EC structures. The bottom EC structures are oriented parallel to each other. Each ReRAM device includes a bottom electrode, a conductive filament and a top electrode. Each ReRAM is electrically connected to a bottom EC structure and a top EC structure as is shown in FIG. 1.

In FIGS. 2A, 3A, 4A, 5A and 6A, there is shown an exemplary NVM structure along the Y-Y direction and during different processing steps of the present application, while in FIGS. 2B, 3B, 4B, 5B and 6B, there is shown an exemplary NVM structure along the X-X direction and during different processing steps of the present application.

Prior to discussing the present application in detail, it is noted that FIGS. 2A-6B of the present application depict a memory device area in which a non-volatile memory structure in accordance with the present application will be formed. A non-memory device area may be located laterally adjacent to the memory device area illustrated in the present application. The non-memory device area is an area in which interconnect structures, back-end-of-the line (BEOL) capacitors, resistors, and/or eFuses can be formed.

Figure 2A:
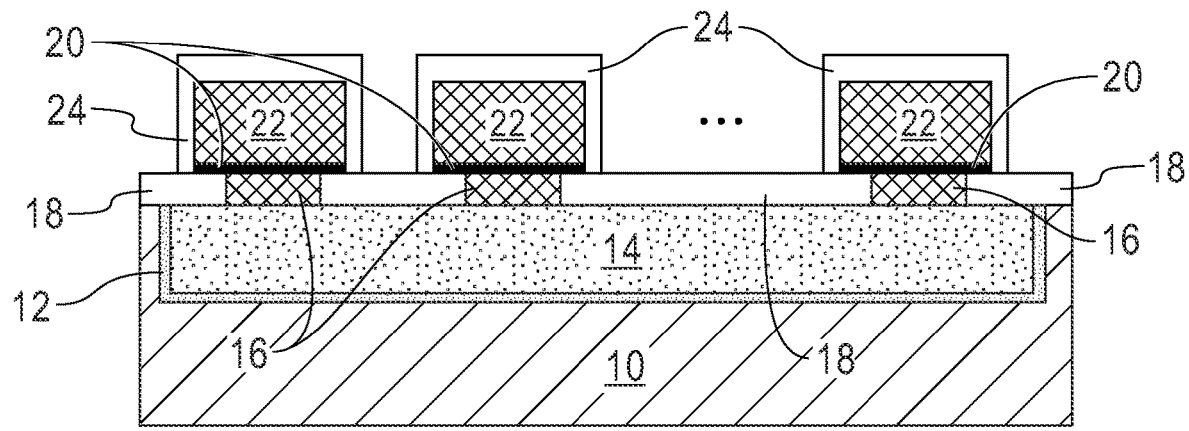
FIG. 2A is a cross sectional view along the Y-Y direction of FIG. 1 of an exemplary NVM structure that can be employed in accordance with an embodiment of the present application, the NVM structure including first electrically conductive structures embedded in a first interlayer dielectric material layer, bottom electrodes located above the first electrically conductive structures and embedded in a dielectric capping layer, a dielectric switching layer located above each bottom electrode, and a top electrode located above each dielectric switching layer.
Figure 2B:
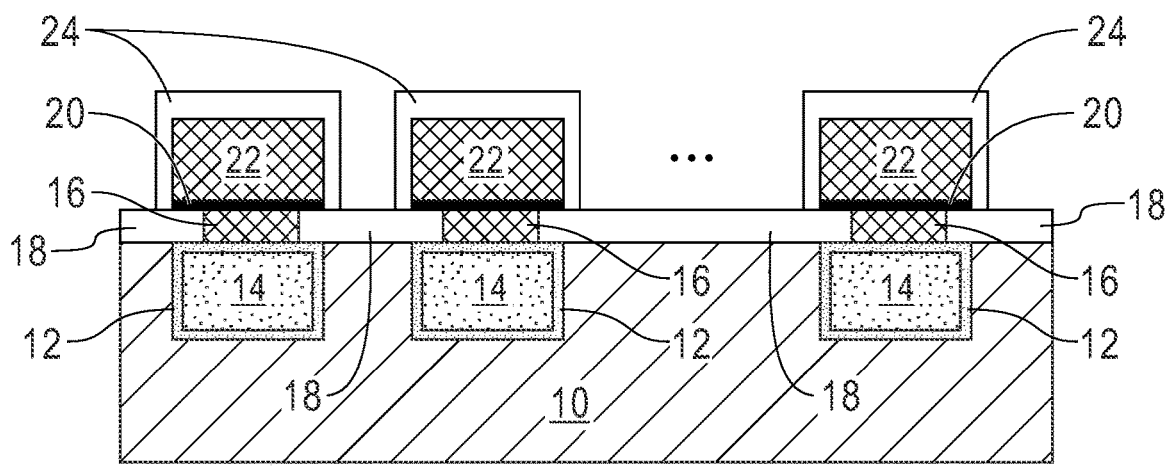
FIG. 2B is a cross sectional view along the X-X direction of FIG. 1 of an exemplary NVM structure that can be employed in accordance with an embodiment of the present application, the NVM structure including first electrically conductive structures embedded in a first interlayer dielectric material layer, bottom electrodes located above the first electrically conductive structures and embedded in a dielectric capping layer, a dielectric switching layer located above each bottom electrode, and a top electrode located above each dielectric switching layer.

Referring now to FIGS. 2A-2B, there are shown an exemplary NVM structure that can be employed in accordance with an embodiment of the present application. The exemplary NVM structure includes first electrically conductive structures 14 embedded in a first interlayer dielectric material layer 10, bottom electrodes 16 located above the first electrically conductive structures 14 and embedded in a dielectric capping layer 18, a dielectric switching layer 20 located above each bottom electrode 16, and a top electrode 22 located above each dielectric switching layer 20. Collectively, the bottom electrode 16, the dielectric switching layer 20 and the top electrode 22 provide a precursor ReRAM device. As used herein, the term "precursor ReRAM device" denotes a ReRAM prior to performing an electroforming process to convert the dielectric switching layer 20 into a conductive filament 20F (see, for example, FIGS. 6A-6B of the present application). In accordance with the present application, a cross bar array of precursor ReRAM devices is formed. Notably, the precursor ReRAM devices in the cross bar array are arranged in rows and columns as shown in FIG. 1. Any number of precursor ReRAM devices can be present in the cross bar array. In one example, the cross bar array can be a 1000×1000 array. In the drawings, the dotted line between the precursor ReRAM devices present on the left hand side of FIGS. 2A-2B and the sole precursor ReRAM device on the right hand side of FIGS. 2A-2B denotes an area in which additional precursor ReRAM devices arranged in the cross bar pattern can be present.

The exemplary NVM structures of FIGS. 2A-2B can also include an optional diffusion barrier liner 12 located on sidewalls and a bottom wall of each first electrically conductive structure 14. In some embodiments, the diffusion barrier liner 12 can be omitted from being present along the bottom wall of the first electrically conductive structures 14, while in other embodiments the diffusion barrier liner 12 can be completely omitted from the exemplary NVM structure. The exemplary NVM structure of FIGS. 2A-2B can also include a dielectric structure 24 encapsulating the dielectric switching layer 20 and the top electrode 22 of each precursor ReRAM device. Notably, and as is shown in FIGS. 2A-2B, the dielectric structure 24 is present along a sidewall of both the dielectric switching layer 20 and the top electrode 22 of each precursor ReRAM device, as well as being present on a topmost surface of the top electrode 22 of each precursor ReRAM device.

In the present application, the first electrically conductive structures 14 that are embedded in the first ILD material layer 10, and if present the diffusion barrier liner 12, collectively provide a metal level, $M_n$, In metal level, $M_n$, n is any integer starting from 1; the upper limit of 'n' can vary and can be predetermined by the manufacturer of a specific integrated circuit. It should be noted that the first electrically conductive structures 14 can partially extend through the first ILD material layer 10, and/or entirely extend through the first ILD material layer 10. In some embodiments (not shown), other electrically conductive structures such as, for example, metal lines and/or metal vias, can be located directly beneath and in contact with each of the first electrically conductive structures 14.

Although not illustrated in the drawings of the present application, a substrate can be located beneath metal level, $M_n$. The substrate can include a front-end-of the-line (FEOL) level including one or more semiconductor devices, such as, for example, field effect transistors located on a semiconductor material; a middle-of-the-line (MOL) level including a plurality of metal contact structures embedded in a MOL dielectric material layer; at least one lower interconnect level that includes a plurality of lower interconnect structures embedded in a lower interconnect dielectric material layer; or any combination thereof. In one example, the substrate includes a FEOL and a MOL.

The metal level, $M_n$, can be formed utilizing techniques that are known to those skilled in the art. In one embodiment, a damascene process can be used in forming metal level, $M_n$. A damascene process can include forming openings into the first ILD material layer 10, filling the openings with an optional diffusion barrier layer, and an electrically conductive material and, if needed performing a planarization process such as, for example, chemical mechanical polishing (CMP) to remove the optional diffusion barrier layer and the electrically conductive material from the topmost surface of the first ILD material layer 10. The diffusion barrier layer that remains in each opening can be referred to herein as diffusion barrier liner 12, and the electrically conductive material that remains in each opening can be referred to herein as a first electrically conductive structure 14. In some embodiments, and as shown in FIGS. 2A-2B, each first electrically conductive structure 14 has a topmost surface that is coplanar with a topmost surface of the first ILD material layer 10 and, if present, a topmost surface of the diffusion barrier liner 12.

The first ILD material layer 10 can be composed of a dielectric material such as, for example, silicon dioxide, silicon nitride, undoped silicate glass (USG), fluorosilicate glass (FSG), borophosphosilicate glass (BPSG), a spin-on low-k dielectric material, a self-planarizing low-k dielectric (such as, for example, OMTS, OMCATS, TOMCATS, DMDMOS), a chemical vapor deposition (CVD) low-k dielectric material or any combination thereof. The term "low-k" as used throughout the present application denotes a dielectric material that has a dielectric constant of less than 4.0. Illustrative low-k dielectric materials that can be used as the first ILD material layer 10 include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Although not shown, the first ILD material layer 10 can include a multilayered structure that includes at least two different dielectric materials stacked one atop the other. The first ILD material layer 10 can be formed utilizing a deposition process including, for example, chemical vapor deposition (CVD), plasma enhanced chemical vapor deposition (PECVD), evaporation or spin-on coating.

The diffusion barrier layer (and thus the resultant diffusion barrier liner 12) that can optionally be employed in the present application in metal level, $M_n$, includes a diffusion barrier material (i.e., a material that serves as a barrier to prevent a conductive material such as copper from diffusing there through). Examples of diffusion barrier materials that can be used in providing the diffusion barrier layer (and thus the resultant diffusion barrier liner 12) include, but are not limited to, Ta, TaN, Ti, TiN, Ru, RuN, RuTa, RuTaN, W, or WN; in some instances of the present application chemical symbols, as found in the Periodic Table of Elements, are used instead of the full names of the elements or compounds. In some embodiments, the diffusion barrier material can include a material stack of diffusion barrier materials. In one example, the diffusion barrier material can be composed of a stack of Ta/TaN. The diffusion barrier layer can be formed by a deposition process such as, for example, CVD, PECVD, or physical vapor deposition (PVD).

The electrically conductive material that provides each of the first electrically conductive structures 14 can include, but is not limited to, Cu, Al, W, Ru or any alloy thereof (i.e., a Cu—Al alloy). The electrically conductive material that provides each of the first electrically conductive structures 14 can be formed by a deposition process such as, for example, CVD, PECVD, PVD, sputtering or electroplating. In some embodiments, a reflow anneal can follow the deposition of the electrically conductive material that provides the first electrically conductive structures 14.

In some embodiments (not shown), an upper portion of each first electrically conductive structure 14 can be etched back such that the topmost surface of each first electrically conductive structure 14 is located beneath the topmost surface of the first ILD material layer 10. In such an embodiment, at lower portion of the bottom electrode 16 (to be formed in a latter processing step of the present application) will be embedded in an upper portion of the first ILD material layer 10. Typically, and as stated above, each first electrically conductive structure 14 has a topmost surface that is coplanar with a topmost surface of the first ILD material layer 10.

After forming the metal level, $M_n$, bottom electrode 16 is formed. Each bottom electrode 16 forms an interface with one of the first electrically conductive structures 14. Each bottom electrode 16 has a width (i.e., critical dimension, CD) that is smaller than a width (i.e., critical dimension, CD) of the first electrically conductive structures 14 such that a portion of each first electrically conductive structure 14 is available for subsequent contact formation. The bottom electrodes 16 can be composed of an oxygen deficient conductive material such as, for example, Ta, TaN, Ti, TiN, Ru, RuN, RuTa, RuTaN, Cu, Co, CoWP, CoN, W, WN or any combination thereof. The bottom electrodes 16 can have a thickness from 2 nm to 80 nm; other thicknesses are possible and can be used in the present application as the thickness of the bottom electrodes 16. The bottom electrodes 16 can be formed by a deposition process such as, for example, sputtering, electroplating, electroless plating, atomic layer deposition (ALD), CVD, PECVD or PVD. In some embodiments, an etch back process, a planarization process (such as, for example, chemical mechanical polishing), or a patterning process (such as, for example, photolithography and etching) can follow the deposition of the conductive material that provides the bottom electrodes 16.

In some embodiments, and as shown in FIGS. 2A-2B, each bottom electrode 16 is formed on a topmost surface of a first electrically conductive structure 14 and each bottom electrode 16 is embedded in a dielectric capping layer 18. The dielectric capping layer 18 can be composed of any dielectric capping material including, for example, silicon nitride ($Si_3N_4$), a nitrogen and hydrogen doped silicon carbide (SiC(N,H)) or a multilayered stack of at least one of the aforementioned dielectric capping materials. The dielectric capping material that provides the dielectric capping layer 18 is compositionally different from the first ILD material layer 10. The dielectric capping material that provides the dielectric capping layer 18 can be formed utilizing a deposition process such as, for example, CVD, PECVD, ALD, chemical solution deposition or evaporation.

In one embodiment, the dielectric capping layer 18 is formed on an entirety of the metal, $M_n$. Openings are then formed, by photolithography and etching, into the dielectric capping layer 18. The openings that are formed into the dielectric capping layer 18 physically exposes a surface of one of the first electrically conductive structure 14. Next, bottom electrode 16 is formed into each opening that is present in the dielectric capping layer 18.

In another embodiment, the bottom electrode 16 is formed by deposition and patterning, and thereafter, dielectric capping layer 18 is formed laterally adjacent to the bottom electrode 16.

In some embodiments (not illustrated), the bottom electrodes 16 can be formed on a recessed surface of each first electrically conductive structure 14. Recessing of the first electrically conductive structures 14 includes a recess etch; the recess etch can also recess the diffusion barrier liner 12 if the same is present in the structure. In embodiments in which the bottom electrodes 16 are formed on a recessed surface of each first electrically conductive structure 14, the dielectric capping layer 18 can be omitted from the structure, and the bottom electrode 16 can have a topmost surface that is coplanar with, or beneath, a topmost surface of the first ILD material layer 10.

After forming the bottom electrodes 16, a patterned material stack including a dielectric switching layer 20 and a top electrode 22 is formed above each of the bottom electrodes 16; the dielectric switching layer 20 and the top electrode 22 form an upper portion of each precursor ReRAM device; the lower portion includes the bottom electrode 16. The patterned material stacks can be formed by deposition of the various materials (i.e., dielectric switch material and top electrode material) present in the material stack (see below for the various deposition processes that can be used for each material) and patterning. Patterning includes lithography and etching. In some embodiments, dielectric hard masks (not shown) can be formed upon a non-patterned material stack of dielectric switching material and top electrode material prior to patterning. The dielectric hard masks can be composed of a dielectric hard mask material such as, for example, silicon nitride, silicon oxynitride or any combination thereof. The dielectric hard masks can be formed utilizing a deposition process such as, for example, CVD, PECVD, ALD, chemical solution deposition or evaporation, followed by patterning The dielectric hard masks can have a thickness from 10 nm to 100 nm; other thicknesses however are contemplated can be used as the thickness of the dielectric hard masks.

As is shown and within each patterned material stack, the dielectric switching layer 20 contacts a surface of at least an underlying bottom electrode 16. A portion of the dielectric switching layer 20 can extend onto a surface of the dielectric capping layer 18. Each dielectric switching layer 20 forms an interface with at least one of the bottom electrodes 16. The dielectric switching layer 20 is a dielectric material such as a dielectric metal oxide that has a dielectric constant of 4.0 or greater. The dielectric switching layer 20 is electrically insulating at this point of the present application and during a subsequent treatment process (to be described in greater detail herein), the dielectric switching layer 20 is converted into a filament that is electrically conducting. Examples of dielectric metal oxides that can be employed as the dielectric switching layer 20 include, but are not limited to, hafnium oxide ($HfO_x$), tantalum oxide ($TaO_x$), titanium oxide ($TiO_x$), aluminum oxide ($AlO_x$), silicon dioxide ($SiO_2$) or combinations thereof. In some embodiments, hydrogen can be present in the dielectric material that provides the dielectric switching layer 20. The dielectric material that provides the dielectric switching layer 20 can be formed utilizing a deposition process such as, for example, CVD, PECVD, ALD, chemical solution deposition or evaporation. The dielectric switching layer 20 can have a thickness from 1 nm to 50 nm; other thicknesses however are contemplated can be used as the thickness of the dielectric switching layer 20. In another embodiment, dielectric switching layer 20 can contain bottom electrode material and then dielectric switching material on top.

Within a patterned material stack, the top electrode 22 forms an interface with the underlying dielectric switching layer 20. The top electrodes 22 can be composed of one of the oxygen deficient conductive materials mentioned above for the bottom electrodes 16. In one embodiment, the top electrodes 22 are composed of an oxygen deficient conductive material that is compositionally the same as the oxygen deficient conductive material that provides the bottom electrode 16. In another embodiment, the top electrodes 22 are composed of an oxygen deficient conductive material that is compositionally different from the oxygen deficient conductive material that provides the bottom electrodes 16. The top electrodes 22 can have a thickness from 2 nm to 80 nm; other thicknesses are possible and can be used in the present application as the thickness of the top electrodes 22. The top electrode material used to provide the top electrodes 22 can be formed by a deposition process such as, for example, sputtering, electroplating, electroless plating, ALD, CVD, PECVD or PVD.

As is shown, the width (i.e., critical dimension) of each patterned material stack of dielectric switching layer 20 and top electrode 22 is greater than the width (i.e., critical dimension) of the bottom electrode 16 which it is in electrical contact with. The widths (i.e., critical dimensions) of top electrode 22 and the dielectric switching layer 20 within each patterned material stack are the same.

In the present application, the bottom electrode 16, dielectric switching layer 20, and the top electrode 22 that provide each precursor ReRAM device can be cylindrical, rectangular, or square in shape; although any symmetrical or asymmetric shape is possible and can be used in the present application as the shape of the bottom electrode 16, dielectric switching layer 20, and the top electrode 22 that provide each precursor ReRAM device (16/20/22). The subsequently formed ReRAM devices can also be cylindrical, rectangular, or square in shape (or any symmetrical or asymmetrical shape can be used) and each component within the subsequently formed ReRAM devices can have a critical dimension as mentioned above.

Dielectric material structure 24, which may include the dielectric hard mask mentioned above, is present on the sidewall and a topmost surface of each precursor ReRAM device (16/20/22). The dielectric material structure 24 can include any dielectric material including, for example, silicon nitride, silicon oxynitride, SiCN, SiCON or any combination thereof. The dielectric material that provides the dielectric structure 24 can be compositionally the same as, or compositional different from, the hard mask material that provides dielectric hard mask. Thus, and in embodiments in which the dielectric hard mask is maintained, the dielectric structure 24 can have a first region that is present on the topmost surface of each precursor ReRAM device (16/20/22) that is composed of the hard mask material, and a second region along the sidewalls of each precursor ReRAM device (16/20/22) that is composed of another dielectric material that differs from the hard mask material. The dielectric structure 24 can be formed by deposition of a dielectric material, if needed a spacer etch can be used. Dielectric structure 24 contacts a sidewall of each of the dielectric switching layer 20 and the top electrode 22 within each patterned material stack. The dielectric structure 24 encapsulates each patterned material stack of the dielectric switching layer 20 and the top electrode 22. This encapsulation layer can be etched back to form a dielectric spacer in another embodiment.

Figure 3A:
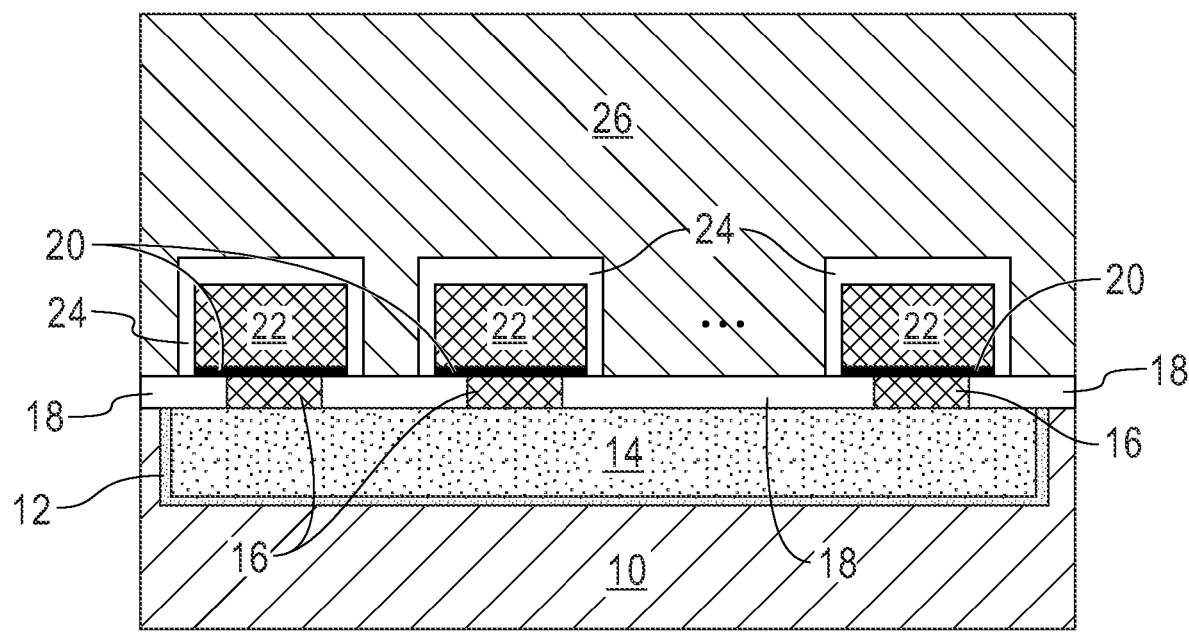
FIG. 3A is a cross sectional view of the exemplary NVM structure of FIG. 2A after forming a second interlayer dielectric material layer.
Figure 3B:
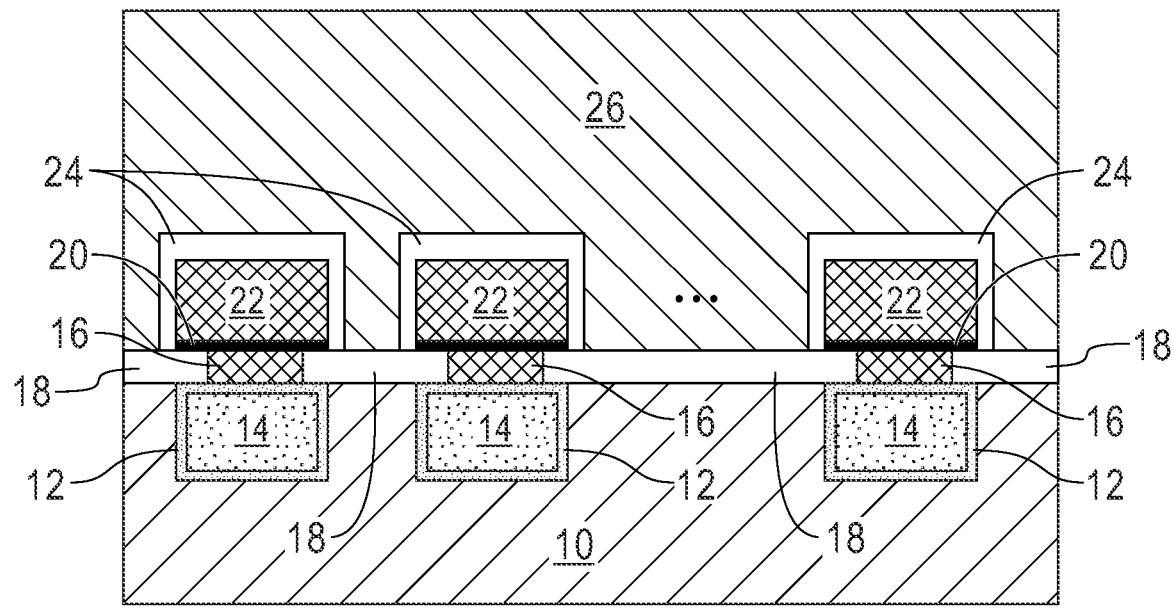
FIG. 3B is a cross sectional view of the exemplary NVM structure of FIG. 2B after forming a second interlayer dielectric material layer.

Referring now to FIGS. 3A-3B, there are illustrated the exemplary NVM structure of FIGS. 2A-2B, respectively, after forming a second ILD material layer 26. The second ILD material layer 26 embeds the dielectric structure 24 and each patterned material stack (20/22) therein (i.e., the upper portion of each precursor ReRAM device (16/20/22)). Notably, and as is shown in FIGS. 3A-3B, the second ILD material layer 26 is formed laterally adjacent to, and atop, each dielectric structure 24 encapsulated patterned material stack 20/22. The second ILD material layer 26 can include one of the dielectric materials mentioned above for the first ILD material layer 10. In one embodiment, the second ILD material layer 26 can be composed of an interconnect dielectric material that is compositionally the same as the dielectric material that provides the first ILD material layer 10. In another embodiment, the second ILD material layer 26 can be composed of an interconnect dielectric material that is compositionally different from the dielectric material that provides the first ILD material layer 10. The second ILD material layer 26 can be formed utilizing one of the deposition processes mentioned above for forming the first ILD material layer 10. In some embodiments, a planarization process such as, for example, chemical mechanical polishing (CMP), can follow the deposition of the dielectric material that provides the second ILD material layer 26. In one embodiment, the second ILD material layer 26 has a thickness from 50 nm to 1000 nm. The second ILD material layer 26 forms a next metal level, $M_{n+1}$, of the exemplary structure.

Figure 4A:
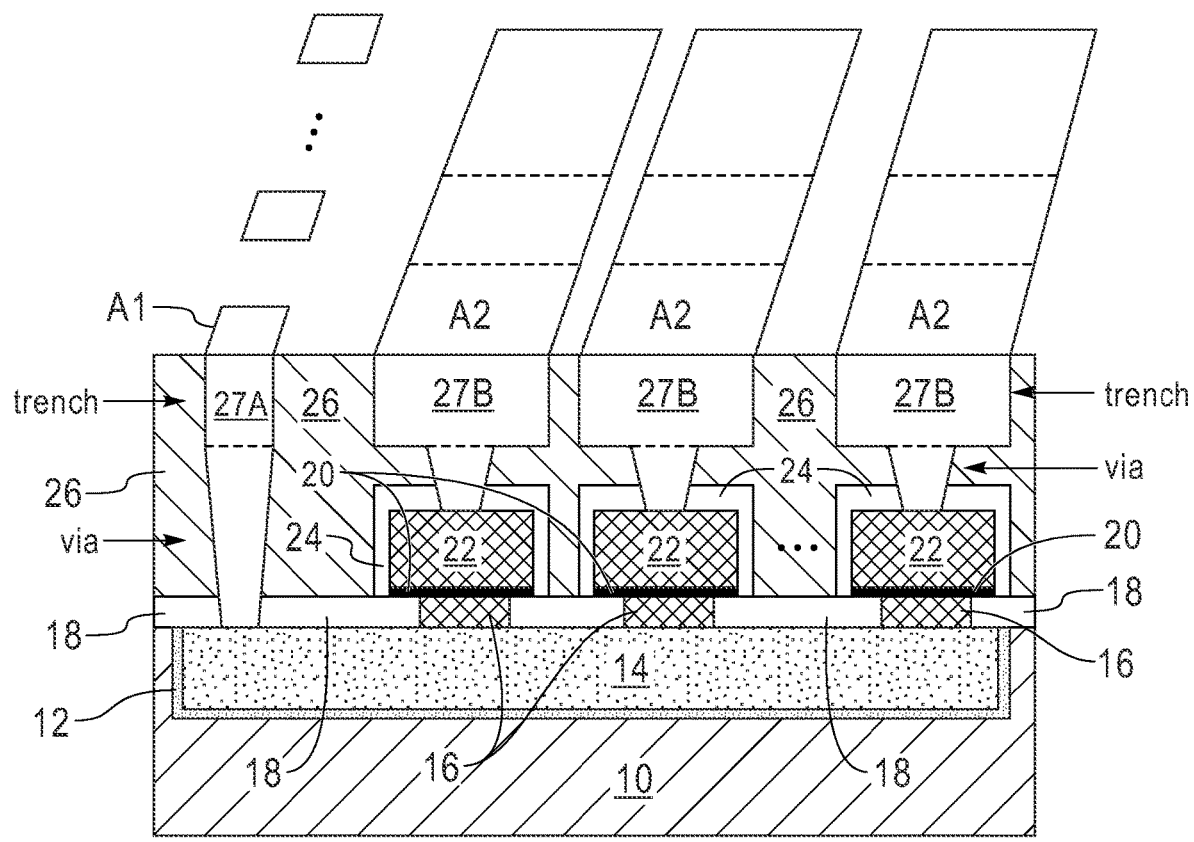
FIG. 4A is a cross sectional view of the exemplary NVM structure of FIG. 3A after forming combined via and trench contact openings.
Figure 4B:
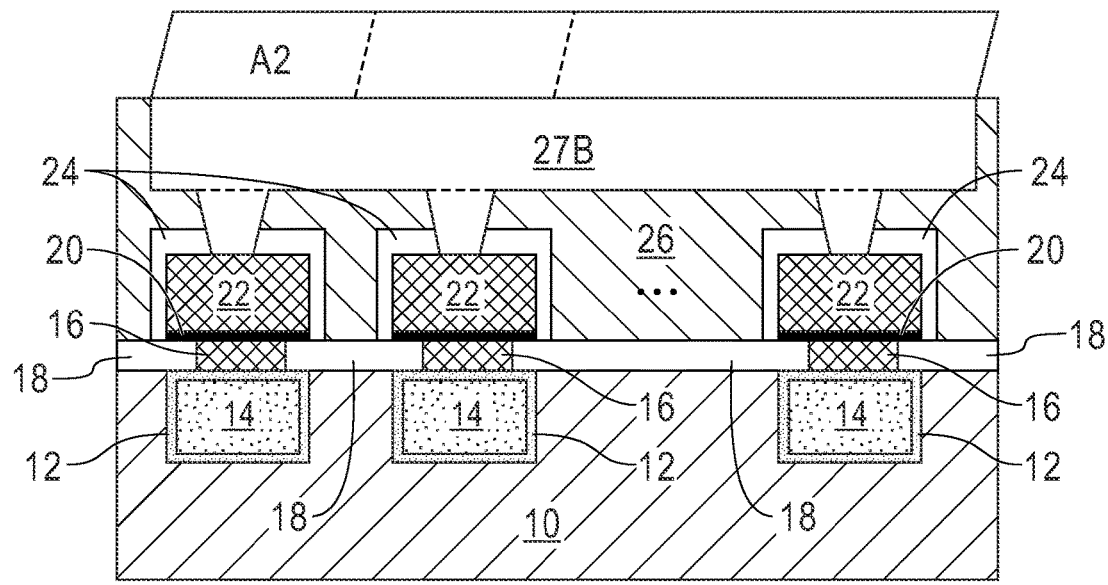
FIG. 4B is a cross sectional view of the exemplary NVM structure of FIG. 3B after forming combined via and trench contact openings.

Referring now to FIGS. 4A-4B, there are shown the exemplary NVM structure of FIGS. 3A-3B, respectively, after forming combined via and trench contact openings 27A, 27B. In accordance with the present invention, each combined via and trench contact opening 27A, 27B has a lower via portion and an upper trench (or line) portion. In FIGS. 4A-4B, a dotted line is used to separate the via portion of the combined via and trench contact openings 27A, 27B from the trench portion of the combined via and trench contact openings 27A, 27B. It is noted that although FIGS. 4A-4B show a single combined via and trench contact opening 27A, a plurality of combined via and trench contact opening 27A can be formed each physically exposing an underlying first electrically conductive structure 14.

As is shown, combined via and trench contact opening 27A extends down through the second ILD material layer 26 and physically exposes a surface of first electrically conductive structure 14 that is embedded in the first ILD material layer 10. Also, and as is shown, each of the combined via and trench contact openings 27B extends through the second ILD material layer 26 and a top portion of the dielectric structure 24 and physically exposes a topmost surface of one of the top electrodes 22.

The combined via and trench contact openings 27A, 27B can be formed utilizing a first lithography and etching step which forms the via portion of each combined via and trench contact openings 27A, 27B, and then a second lithography and etching step can be used to form the trench portion of combined via and trench contact openings 27A, 27B. The combination of the first and second lithographic and etching steps can be referred to herein as a dual damascene process. In the present application, the combined via and trench contact opening 27A is formed in a separate step from the combined via and trench contact openings 27B.

As is further shown, the trench portion of each of the combined via and trench contact openings 27A, 27B starts at a same level within the second ILD material layer. As is even yet further shown, the combined via and trench contact opening 27A has a first exposed trench area, A1, while the combined via and trench contact openings 27B have a second exposed trench area, A2 which is unit area covering one ReRAM pillar 22. In accordance with the present application A2 is much greater than A1. Typically, A1 is made as small as the ground rule allows to land the via portion of the combined via and trench contact opening 27A on the first electrically conductive structure 14. In the present application, A2 is made to be as wide as and as long as possible so to maximum the allowed trench area and provide an increased area that will allow dielectric breakdown on the dielectric switching layers 20 by an antenna effect. Each ReRAM pillar 22 can be spaced out wide in order to occupy the maximum allowed area. At fat wire levels, ReRAM pillar spacing can be much wider so that A2 area can be much wider than that of A1. The term "antenna effect" is used throughout the present application to describe the charge accumulation effect in an isolated mode of an electronic circuit component during processing. Such charge accumulation often occurs due to the charges generated during subsequently performed plasma or e-beam process. Those charges are then collected via exposed metallic surfaces and start to be accumulated in an isolated mode. Such accumulation of charge may induce voltage difference. Then, a certain voltage may be applied to the device if the device is placed between two different isolated nodes. The voltage difference may eventually lead to a flow of current or apply an electrical stress on the device. In such ReRAM devices, the top electrode and the bottom electrode are connected in a fashion to collect charging during the plasma or e-beam treatment, which leads to an induce soft breakdown across the dielectric switching layers using the antenna effect.

In the present application, the ratio of A2 to A1 is greater than 1.0, and more typically the ratio of A2 to A1 is greater than 2.0. In some embodiments, the ratio of A2 to A1 can be greater than 5.0 and even greater than 10.0.

Figure 5A:
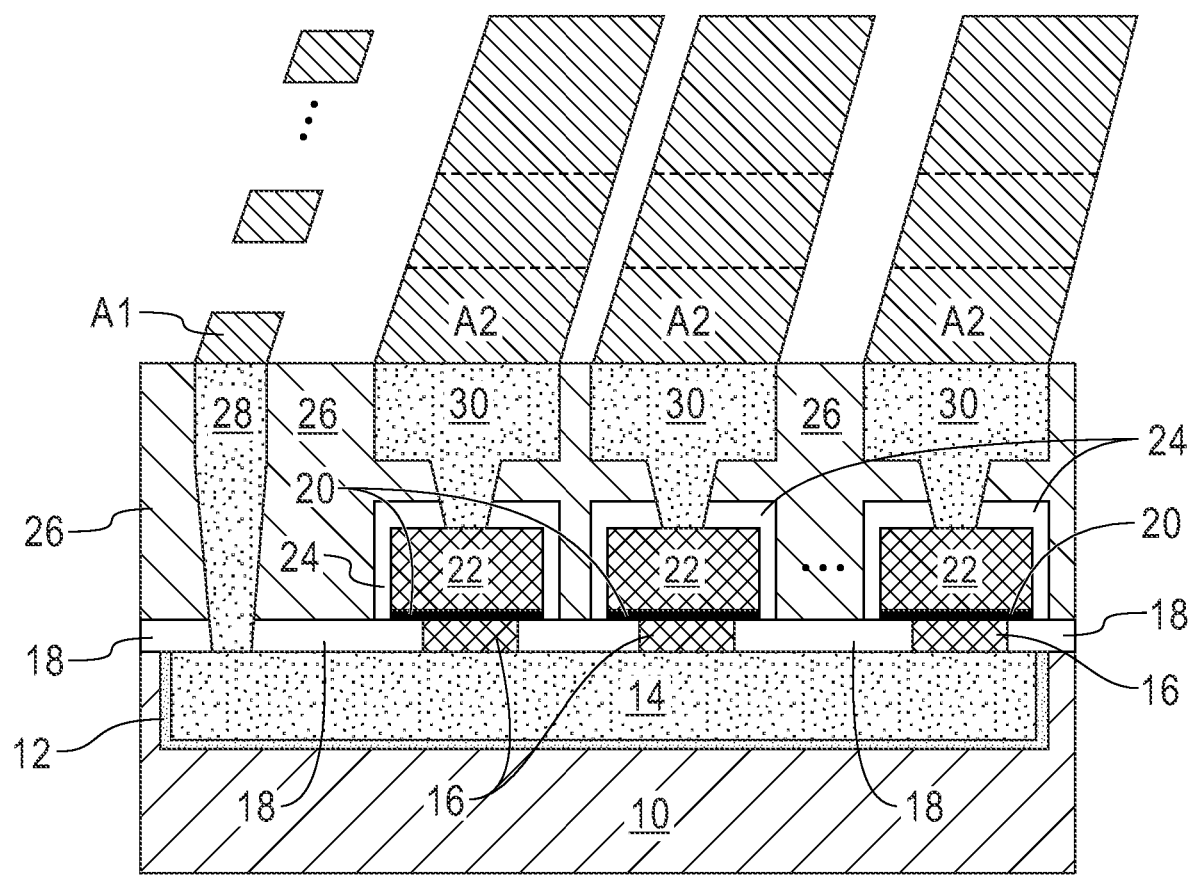
FIG. 5A is a cross sectional view of the exemplary NVM structure of FIG. 4A after forming a second electrically conductive structure in each of the combined via and trench contact openings.
Figure 5B:
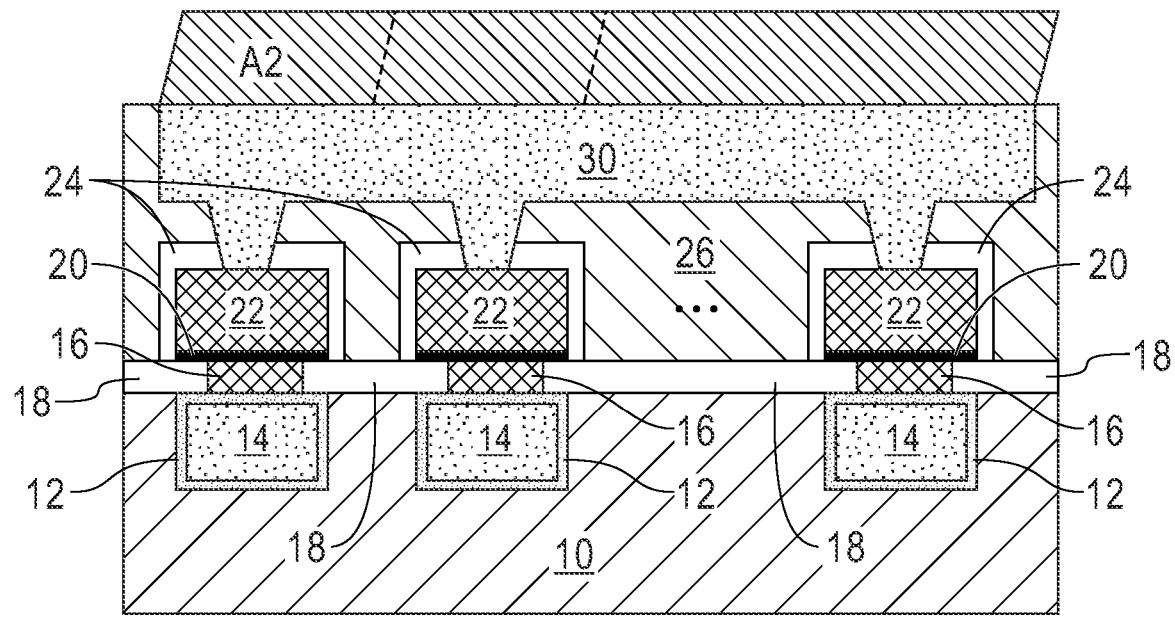
FIG. 5B is a cross sectional view of the exemplary NVM structure of FIG. 4B after forming a second electrically conductive structure in each of the combined via and trench contact openings.

Referring now to FIGS. 5A-5B, there are shown the exemplary NVM structure of FIGS. 4A-4B, respectively, after forming a second electrically conductive structure 28, 30 in each of the combined via and trench contact openings 27A, 27B. Second electrically conductive structure 28 physically contacts the first electrically conductive structure 14, while the second electrically conductive structures 30 physically contact one of the top electrodes 22 of the precursor ReRAM devices (16/20/22).

Each second electrically conductive structure 28, 30 is composed of one of the electrically conductive metals or electrically conductive metal alloys mentioned above for the first electrically conductive structures 14. In some embodiments, each second electrically conductive structure 28, 30 is composed of a compositionally same electrically conductive metal-containing material as the first electrically conductive structures 14. In other embodiments, each second electrically conductive structure 28, 30 is composed of a compositionally different electrically conductive metal-containing material than the first electrically conductive structures 14.

Each second electrically conductive structure 28, 30 has a topmost surface that is coplanar with a topmost surface of the second ILD material layer 26. Each second electrically conductive structure 28, 30 has a trench portion and a via portion that are located at a same level within the second ILD material layer 26. Thus, the trench portions of each second electrically conductive structure have a topmost surface that is coplanar with each other, and each via portion of the second electrically conductive structures 28, 30 have a topmost surface that are coplanar with each other. As is further shown, the second electrically conductive structure 28 has a trench portion having A1, while each second electrically conductive structure 30 has a trench portion having A2 above. Again, A2 is greater than A1 which enhances the antenna effect that occurs during a subsequently performed plasma or e-beam treatment process.

Figure 6A:
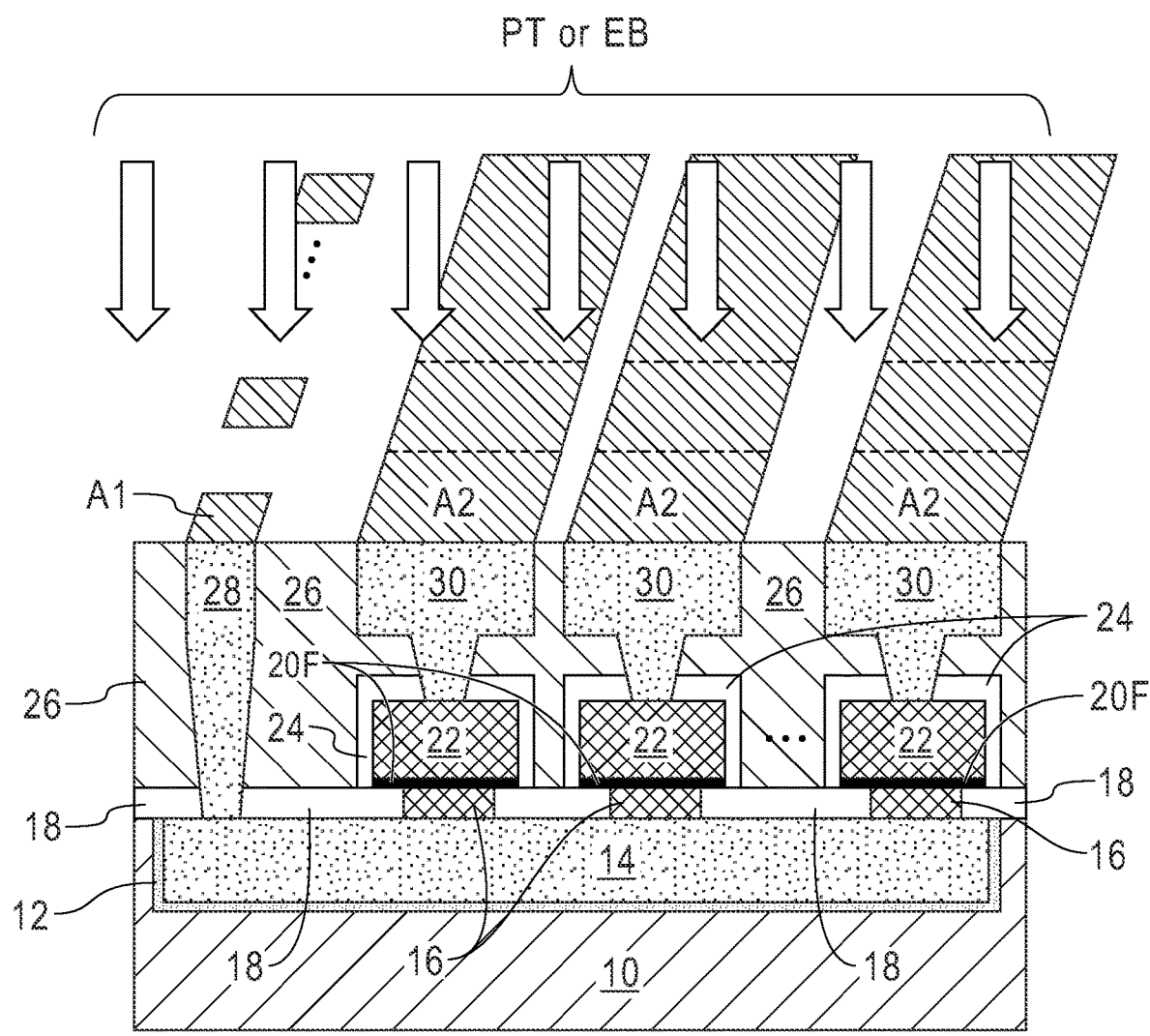
FIG. 6A is a cross sectional view of the exemplary NVM structure of FIG. 5A during a treatment process to induce an antenna effect and convert each dielectric switching layer to a conductive filament.
Figure 6B:
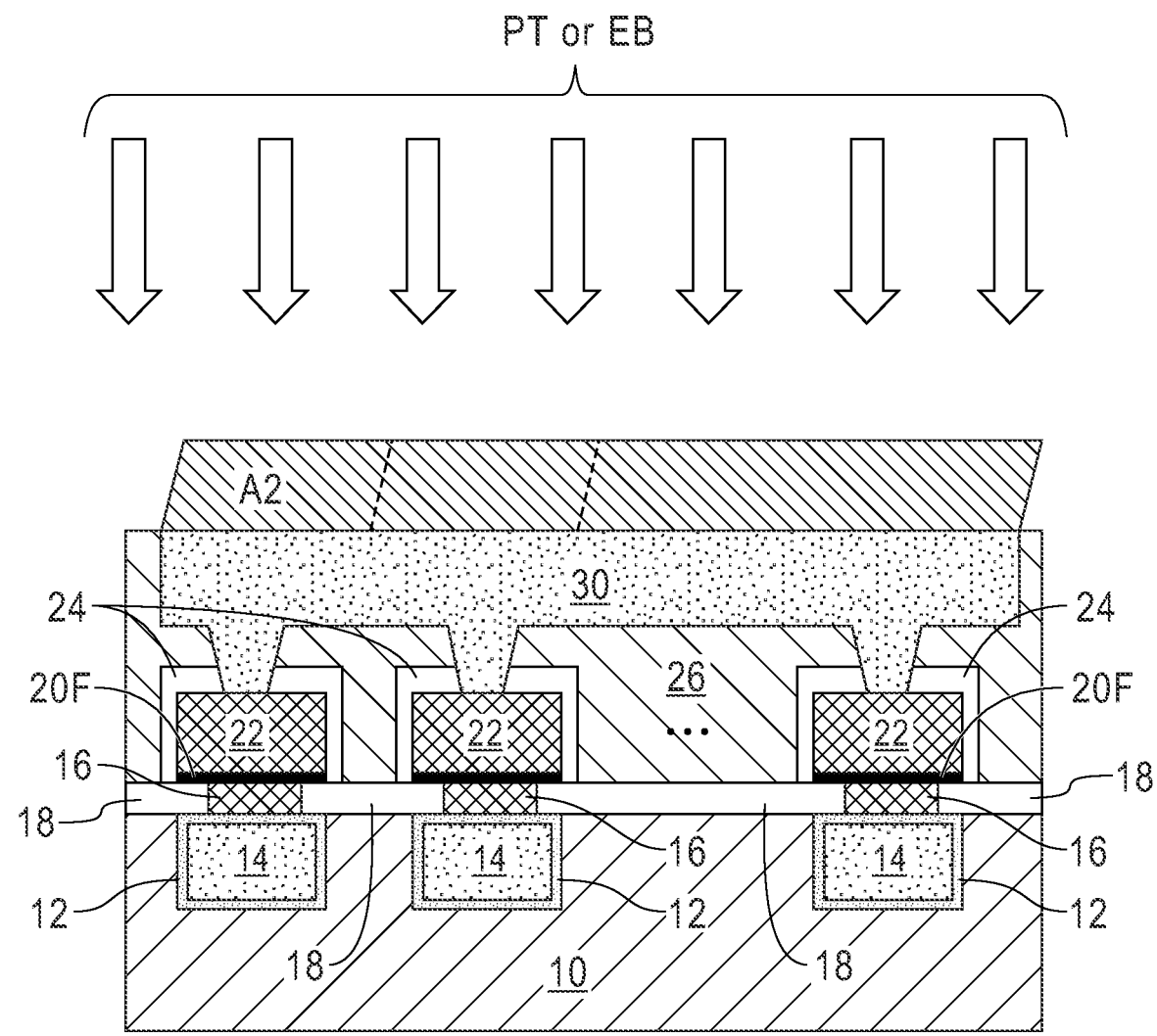
FIG. 6B is a cross sectional view of the exemplary NVM structure of FIG. 5B during a treatment process to induce an antenna effect and convert each dielectric switching layer to a conductive filament.

Referring now to FIGS. 6A-6B, there are shown the exemplary NVM structure of FIGS. 5A-5B, respectively, during a treatment process to induce an antenna effect and convert each dielectric switching layer 20 to a conductive filament 20F. In the present application, the treatment process is a plasma or e-beam process. In FIGS. 6A-6B, 'PT' denotes a plasma treatment process, while 'EB' denotes an e-beam treatment process. The arrows in FIGS. 6A-6B show the direction of the treatment process. Each conductive filament 20F is composed of a switching dielectric material (i.e., the dielectric switching layer 20) that is now electrically conductive due to dielectric breakdown of the original switching dielectric layer 20. The conductive nature of conductive filament 20F is temporary and reversible. Collectively, the bottom electrode 16, the conductive filament 20F, and the top electrode 22 form a ReRAM device of the present application. As mentioned above, a cross bar array of such ReRAM devices (16/20F/22) is formed. Subsequently and during use, the ReRAM devices can switch back to the precursor ReRAM device that includes the bottom electrode 16, the dielectric switching layer 20, and the top electrode 22. Each ReRAM device that is present in the cross bar array is located in the BEOL and is embedded various ILD materials layers (i.e., first and second ILD material layers 10, 26).

In one embodiment of the present application, a plasma treatment is used to induce the antenna effect and to form conductive filaments 20F. In such an embodiment, the plasma treatment includes a plasma process that comprises a gas including, but not limited to, argon, nitrogen, hydrogen, helium, xenon, ammonia or mixtures thereof. In some embodiments, the plasma process that can be used in the present application can include a pressure range from 1 mTorr to 3 Torr, a plasma power ranging from 0.1 kWatts to 10 kWatts, a bias voltage from 0 volts to 50 volts, and a duration for 5 seconds to 15 minutes. The plasma process can be performed using an inductively coupled plasma (ICP) tool, a capacitively coupled plasma (CCP) tool, or a microwave generated plasma tool.

In another embodiment of the present application, an e-beam treatment is used to induce the antenna effect and to form conductive filaments 20F. In such an embodiment, the e-beam treatment includes a e-beam process that comprises an electron energy from 0.01 kv to 100 kv, and an electron beam dose of 100 $\mu C/cm^2$ to 5000 $\mu C/cm^2$.

After inducing the antenna effect, the cross bar array can be connected with metal oxide semiconductor field effect transistors (MOSFETs) at the next level with a bridge connection.

FIGS. 6A-6B illustrate an exemplary NVM structure of the present application. The exemplary NVM includes a plurality of first electrically conductive structures 14 oriented in a first direction e.g., Y-Y. The NVM structure further includes a plurality of ReRAM devices arranged in rows and columns and located on the plurality of first electrically conductive structures 14, wherein each ReRAM device 16/20F/22 of the plurality of ReRAM devices comprises bottom electrode 16, a metal oxide layer (i.e., conductive filament 20F), and top electrode 22. The NVM structure even further includes a plurality of second electrically conductive structures 28, 30 located above the plurality of ReRAM devices 16/20F/22 and oriented in a second direction which is perpendicular to the first direction. In accordance with the present application, the plurality of second electrically conductive structures 28/30 includes a first set (i.e., second electrically conductive structure 28) of second electrically conductive structures having a first top trench area A1, and a second set of second electrically conductive structures (i.e., second electrically conductive structures 30) having a second top trench area A2 that is greater than the first top trench area A1. In the present application, each second electrically conductive structure 28 of the first set of second electrically conductive structures contacts a surface of at least one of the first electrically conductive structures 14 of the plurality of first electrically conductive structures, and each second electrically conductive structure 30 of the second set of second electrically conductive structures contacts the top electrode 22 of at least one of the ReRAM devices.

The terminology used herein is for the purpose of describing particular embodiments only and. is not intended to be limiting of the present application. As used herein, the singular forms "a", "an" and "the" are intended to include the plural forms as well, unless the context clearly indicates otherwise. It will be further understood that the terms "comprises" and/or "comprising", when used in this application, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A non-volatile memory (NVM) structure comprising:
    a plurality of first electrically conductive structures oriented in a first direction;
    a plurality of random access memory (ReRAM) devices arranged in rows and columns and located on the plurality of first electrically conductive structures, wherein each ReRAM device of the plurality of ReRAM devices comprises a bottom electrode, a metal oxide layer, and a top electrode; and
    a plurality of second electrically conductive structures located above the plurality of ReRAM devices and oriented in a second direction which is perpendicular to the first direction, wherein the plurality of second electrically conductive structures comprises a first set of second electrically conductive structures having a first top trench area, and a second set of second electrically conductive structures having a second top trench area that is greater than the first top trench area, wherein each second electrically conductive structure of the first set of second electrically conductive structures contacts a surface of at least one of the first electrically conductive structures of the plurality of first electrically conductive structures, and each second electrically conductive structure of the second set of second electrically conductive structures contacts the top electrode of at least one of the ReRAM devices.

2. The NVM structure of claim 1, wherein a ratio of the second top trench area to the first top trench area is greater than 1.0.

3. The NVM structure of claim 2, wherein the ratio of the second top trench area to the first top trench area is greater than 5.

4. The NVM structure of claim 1, wherein the top electrode and the metal oxide layer have a critical dimension that is greater than a critical dimension of the bottom electrode.

5. The NVM structure of claim 4, wherein the critical dimension of the top electrode is the same as the critical dimension of the metal oxide layer.

6. The NVM structure of claim 1, wherein each ReRAM device of the plurality of ReRAM devices is encapsulated in a dielectric structure.

7. The NVM structure of claim 1, wherein each second electrically conductive structure of the first and second sets of second electrically conductive structures comprises a lower via portion and an upper trench portion.

8. The NVM structure of claim 7, wherein the lower via portion of each second electrically conductive structure of the first set of second electrically conductive structures has a topmost surface that is coplanar with a topmost surface of the lower via portion of each second electrically conductive structure of the first set of second electrically conductive structures.

9. The NVM structure of claim 7, wherein the upper trench portion of each second electrically conductive structure of the first set of second electrically conductive structures has a topmost surface that is coplanar with a topmost surface of the upper trench portion of each second electrically conductive structure of the first set of second electrically conductive structures.

10. The NVM structure of claim 1, wherein the plurality of first electrically conductive structures are embedded in a first interlayer dielectric material layer, and at least the plurality of second electrically conductive structures, the top electrode of each ReRAM device, and the metal oxide layer of each ReRAM device are embedded in a second interlayer dielectric material layer that is located above the first interlayer dielectric material layer.

11. The NVM structure of claim 10, wherein the bottom electrode of each ReRAM device is embedded in a dielectric capping layer that is located between the first interlayer dielectric material layer and the second interlayer dielectric material layer.

12. The NVM structure of claim 1, wherein the metal oxide layer is a conductive filament and comprises hafnium oxide, tantalum oxide, titanium oxide, aluminum oxide, silicon dioxide or combinations thereof.

13. The NVM structure of claim 12, wherein the metal oxide layer contains hydrogen.

14. The NVM structure of claim 1, wherein the metal oxide layer directly contacts a surface of the bottom electrode and a surface of a dielectric capping layer that is located laterally adjacent to the bottom electrode.

15. A method of forming a non-volatile memory (NVM) structure, the method comprising:
    forming a plurality of first electrically conductive structures oriented in a first direction;
    forming a plurality of random access memory (ReRAM) devices on the plurality of first electrically conductive structures, wherein each ReRAM device of the plurality of ReRAM devices comprises a bottom electrode, a dielectric switching layer, and a top electrode; and
    forming a plurality of second electrically conductive structures above the plurality of ReRAM devices and oriented in a second direction which is perpendicular to the first direction, wherein the plurality of second electrically conductive structures comprises a first set of second electrically conductive structures having a first top trench area, and a second set of second electrically conductive structures having a second top trench area that is greater than the first top trench area, wherein each second electrically conductive structure of the first set of second electrically conductive structures contacts a surface of at least one of the first electrically conductive structures of the plurality of first electrically conductive structures, and each second electrically conductive structure of the second set of second electrically conductive structures contacts the top electrode of at least one of the ReRAM devices; and performing a treatment process to induce an antenna effect and convert each dielectric switching layer to a conductive filament.

16. The method of claim 15, wherein the treatment process comprises a plasma process.

17. The method of claim 15, wherein the treatment process comprises an e-beam process.

18. The method of claim 15, wherein the plurality of first electrically conductive structures are embedded in a first interlayer dielectric material layer, and at least the plurality of second electrically conductive structures, the top electrode of each ReRAM device, and the dielectric switching layer of each ReRAM device are embedded in a second interlayer dielectric material layer that is formed above the first interlayer dielectric material layer.

19. The method of claim 18, wherein the bottom electrode of each ReRAM device is embedded in a dielectric capping layer that is formed between the first interlayer dielectric material layer and the second interlayer dielectric material layer.

20. The method of claim 15, wherein a ratio of the second top trench area to the first top trench area is greater than 1.0.

* * * * *